United States Patent
Zhou et al.

(10) Patent No.: US 9,482,831 B2
(45) Date of Patent: Nov. 1, 2016

(54) SILICA-ON-SILICON-BASED HYBRID INTEGRATED OPTOELECTRONIC CHIP AND MANUFACTURING METHOD THEREFOR

(71) Applicant: Wuhan Telecommunication Devices Co., Ltd., Wuhan, Hubei Province (CN)

(72) Inventors: Liang Zhou, Wuhan (CN); Xiaoge Cao, Wuhan (CN); Xianghong Yu, Wuhan (CN)

(73) Assignee: WUHAN TELECOMMUNICATION DEVICES CO., LTD., Wuhan, Hubei Province (CN)

( * ) Notice: Subject to any disclaimer, the term of this patent is extended or adjusted under 35 U.S.C. 154(b) by 0 days.

(21) Appl. No.: 14/758,416

(22) PCT Filed: Dec. 26, 2013

(86) PCT No.: PCT/CN2013/090492
§ 371 (c)(1),
(2) Date: Jun. 29, 2015

(87) PCT Pub. No.: WO2014/101780
PCT Pub. Date: Jul. 3, 2014

(65) Prior Publication Data
US 2015/0355424 A1 Dec. 10, 2015

(30) Foreign Application Priority Data
Dec. 28, 2012 (CN) .......................... 2012 1 0586072

(51) Int. Cl.
*G02B 6/12* (2006.01)
*G02B 6/42* (2006.01)
(Continued)

(52) U.S. Cl.
CPC .............. *G02B 6/4257* (2013.01); *G02B 6/122* (2013.01); *G02B 6/305* (2013.01); *G02B 6/42* (2013.01);
(Continued)

(58) Field of Classification Search
CPC ................ H01L 2924/00; H01L 2924/00014; G02B 6/43; G02B 6/4214; G02B 6/12; G02B 6/4257; G02B 6/4232
USPC .................................. 385/14, 15, 27, 30, 31
See application file for complete search history.

(56) References Cited

U.S. PATENT DOCUMENTS 8,116,624 B1 * 2/2012 Wach ..................... G01M 11/35
398/20
9,151,664 B2 * 10/2015 Wyss .................. H01L 31/0232

FOREIGN PATENT DOCUMENTS

CN          1977200 A       6/2007
CN         101271175 A       9/2008
(Continued)

*Primary Examiner* — Jennifer Doan
(74) *Attorney, Agent, or Firm* — Muncy, Geissler, Olds & Lowe, P.C.

(57) ABSTRACT

Provided are a silica-on-silicon-based hybrid integrated optoelectronic chip and a manufacturing method therefor. The hybrid integrated optoelectronic chip comprises a silicon substrate (1), wherein the surface of the silicon substrate (1) is provided with a platform (8), lug bosses (6,7) and a groove (10); a silica waveguide element (2) is arranged in the groove (10), the lug bosses (6,7) are protruded from the surface of the platform (8), and the surface of the platform (8) is provided with a discontinuous metal electrode layer (3); and the surface of the metal electrode layer (3) is provided with solder bumps (4), and an active optoelectronic chip (5) is arranged above the solder bumps (4) and the lug bosses (6, 7). In the manufacturing method, multi-step processes including material growth, hot oxygen bonding, flip-chip bonding, lithography alignment and the like are adopted, thereby guaranteeing the high-efficiency light coupling among waveguide devices of different materials, and reducing the light reflection between waveguide end faces. A high-frequency electrode composed of alternating current electrode areas (26) is manufactured between the alignment lug bosses (6, 7). Due to the fact that flip-chip bonding technology is beneficial to the transmission of high-frequency signals, integration level between devices is improved. Meanwhile, the process design not only can achieve the chip-level probe test, but also can be used for the subsequent gold ball bonding or wedge bonding process, thereby facilitating the achievement of encapsulation and mass production of hybrid integrated chips.

10 Claims, 5 Drawing Sheets

(51) Int. Cl.
*G02B 6/30* (2006.01)
*G02B 6/122* (2006.01)
*H01L 31/12* (2006.01)
*H01L 31/18* (2006.01)

(52) U.S. Cl.
CPC ........... *G02B 6/4224* (2013.01); *G02B 6/4232* (2013.01); *H01L 31/12* (2013.01); *H01L 31/18* (2013.01)

(56) References Cited

FOREIGN PATENT DOCUMENTS

| | | |
|---|---|---|
| CN | 102005497 A | 4/2011 |
| CN | 102053318 A | 5/2011 |
| CN | 103066148 A | 4/2013 |
| KR | 10-2005-0070263 A | 7/2005 |

\* cited by examiner

SILICA-ON-SILICON-BASED HYBRID INTEGRATED OPTOELECTRONIC CHIP AND MANUFACTURING METHOD THEREFOR

TECHNICAL FIELD

The invention relates to the technical field of photon integrated devices, specifically to a silica-on-silicon-based hybrid integrated optoelectronic chip and a manufacturing method therefor, and can be applied in combining of output light from a plurality of lasers or in spectroscopic exploration of a multi-wavelength light source.

BACKGROUND ART

With the development of micro/nanometer optoelectronic integrated technology, more and more cores are integrated into a chip, the size of a device is continuously reduced, but the operational speed of a device is continuously increased.

In terms of optical active devices, lasers based on III-V material, such as InP, GaAs, etc., and electro-absorption modulated lasers have been developed from chip research to mass production, the encapsulated devices of which have been applied, as mature light sources, to optoelectronic fields such as optical communication, optical medical treatment, etc., and the speed of the devices ranges from hundreds of megabits per second to tens of gigabits per second.

Meanwhile, commercial production for silicon-based optical waveguide devices in optical passive devices, such as light beam splitters, AWG, etc., has been achieved for a long time due to their easy process, low optical transmission loss and easy to be coupled with an optical fiber. Passive waveguide material includes a plurality of materials such as silica, silica-on-silicon, silicon-on-insulator, etc.

With the development of future optoelectronic technology, it has become an inevitable development direction for integrated optoelectronic chips to integrate III-V lasers with silicon-based waveguide devices onto one chip, through which not only the cost of devices is reduced but also the high performance of each element is used. Among other things, it is the most practical technical route at present that an optoelectronic chip be flip-chip bonded on silicon-based waveguide materials, because not only various silica waveguides grow on silicon material, but also silicon material has the heat conductivity coefficient that is close to that of metal and is an ideal heat-sinking material for lasers. As a result, silicon material is an ideal substrate material to achieve hybrid integration of lasers with silicon-based waveguides.

There exists a plurality of difficulties in the hybrid integration due to different properties of materials, included in which the optical coupled alignment problem between waveguides of a laser or a detector and silica waveguides, the loading or transmission problem of high frequency signals in a laser or a detector, the complex process, the high cost, and the heat dissipation for the integrated devices, etc. Therefore, a hybrid integrated chip design, which is easy in process, effective, and practical, is urgently desired to solve the above problems.

CONTENT OF THE INVENTION

The problem to be solved by the invention is to provide a silica-on-silicon-based hybrid integrated optoelectronic chip and a manufacturing method therefor. Mature silicon-material process is used by the hybrid integrated chip, lug bosses, a groove and silica waveguide structures with high reflective index on a silicon substrate are designed, and alignment coupling is easily achieved. Meanwhile, a high-frequency electrode is manufactured and a solder bumps structure is flip bonded under the lug bosses of the invention, both the high-frequency signals can be transmitted and the direct-current driving signals can be loaded and accurate alignment can be achieved by the active optoelectronic chip.

The silica-on-silicon-based hybrid integrated optoelectronic chip provided by the invention comprises a silicon substrate, the surface of the silicon substrate is provided with a platform, lug bosses and a groove, a silica waveguide element is arranged in the groove, the lug bosses are protruded from the surface of the platform, the surface of the platform is provided with a discontinuous metal electrode layer, the surface of the metal electrode layer is provided with solder bumps, and an active optoelectronic chip is arranged above the solder bumps and the lug bosses.

Further, the silica waveguide element comprises longitudinally in sequence a silica substrate layer, a silica waveguide layer and a silica upper covering layer; the silica waveguide element comprises horizontally in sequence a waveguide area, a coupling area in close proximity to the active optoelectronic chip and a coupling area in close proximity to an optical fiber; the width of the waveguide in the coupling area in close proximity to the active optoelectronic chip is 3 μm-7 μm; and the width of the waveguide in the coupling area in close proximity to the optical fiber is 6 μm-10 μm.

Further, the lug bosses comprise a horizontal alignment lug boss and a vertical alignment lug boss, and the height of the horizontal alignment lug boss is equal to that of the vertical alignment lug boss, both of which being 10 μm-100 μm.

Further, the number and the horizontal position of the horizontal alignment lug boss are determined by the relative position of an alignment mark on the active optoelectronic chip and the waveguide on the active optoelectronic chip, the height of the vertical alignment lug boss is determined by the vertical position of the silica waveguide layer in the silica waveguide element, and the vertical alignment lug boss is arranged at the middle part of the active optoelectronic chip.

Further, the thickness of the metal electrode layer is 0.2 μm-3 μm, and the metal electrode layer comprises a direct-current electrode area, an alternating-current electrode area, a ground electrode area and an alignment pattern electrode area; the lug bosses are arranged between the direct-current electrode area and the alternating-current electrode area, and the direct-current electrode area and the alternating-current electrode area, above which solder bumps are manufactured, contact with the direct-current electrode and the alternating-current electrode of the active optoelectronic chip through the solder bumps; a frontal alignment mark of the active optoelectronic chip and the horizontal alignment lug boss or the alignment mark of the metal electrode layer are aligned; and a back electrode of the active optoelectronic chip is connected with the ground electrode area of the metal electrode layer.

Further, the silica waveguide element is provided with an outer end face at 5°-45° inclination to the vertical direction.

A manufacturing method for a silica-on-silicon-based hybrid integrated optoelectronic chip is provided by the invention, comprising a few steps below:

Step 1: manufacturing a silicon substrate and manufacturing a silica waveguide element in a groove of the silicon substrate;

Step 2: manufacturing a metal electrode layer on the silicon substrate;

Step 3: manufacturing solder bumps above the direct-current electrode area and the alternating-current electrode area of the metal electrode layer;

Step 4: Soldering an active optoelectronic element above the solder bumps and a vertical alignment lug boss.

Further, a silica growth process or a silica thermal bonding process is used in manufacturing the silica waveguide element in the step 1.

Further, the step 1 includes a few steps below when a silica thermal bonding process is used in manufacturing the silica waveguide element:

Step 1: manufacturing a lug boss on the surface of the silicon substrate;

Step 2: manufacturing a groove on one side of the lug boss on the silicon substrate;

Step 3: growing a silica bonding layer on the bottom of the groove, manufacturing the silica waveguide element into the groove structure by using the silica thermal bonding process so that the bonding layer is melted into the silica substrate layer of the silica waveguide element and the silica waveguide element is provided with an outer end face at 5°-45° inclination to the vertical direction.

Further, the step 1 includes a few steps below when the silica growth process is used in manufacturing the silica waveguide element:

Step 1: growing a silica substrate layer and a silica waveguide layer on the surface of the silicon substrate, and etching off a part of the silica waveguide layer to form a reserved area;

Step 2: growing an upper covering layer above the silica waveguide layer that is reserved;

Step 3: etching the silica substrate layer in the reserved area to the surface of the silicon substrate to form a lug boss.

The advantages of the invention lie in that:

A silica-on-silicon-based hybrid integrated optoelectronic chip and a manufacturing method therefor are provided by the invention, and multi-step processes including material growth, hot oxygen bonding, flip-chip bonding, photo etching alignment and the like are used, thereby guaranteeing the high-efficiency light coupling among waveguide devices of different materials, and reducing the light reflection between waveguide end faces. A high-frequency electrode is manufactured between the horizontal and vertical alignment lug bosses, and due to the fact that flip-chip bonding technology is beneficial to the transmission of high-frequency signals, integration level between devices is improved. Meanwhile, the process design not only can achieve the chip-level probe test, but also can be used for the subsequent gold ball bonding or wedge bonding process, thereby facilitating the achievement of encapsulation and mass production of hybrid integrated chips.

BRIEF DESCRIPTION OF THE DRAWINGS

FIG. 3a-FIG. 3e are schematic flowcharts for manufacturing the silica-on-silicon-based waveguide using the silica growth process;

In the figures: 1-silicon substrate; 2-silica waveguide element; 3-metal electrode layer; 4-solder bumps; 5-active optoelectronic chip; 6-horizontal alignment lug boss; 7-vertical alignment lug boss; 8-platform; 9-a first optical resist layer; 10-groove; 11-a second optical resist layer; 12-silica bonding layer; 13-silica substrate layer; 14-silica waveguide layer; 15-silica upper covering layer; 16-coupling area in close proximity to the active optoelectronic chip; 17-general waveguide area; 18-coupling area in close proximity to an optical fiber; 19-outer end face; 20-reserved area; 21-a third optical resist layer; 22-a fourth optical resist layer; 23-silica vertical alignment lug boss; 24-silica horizontal alignment lug boss; 25-direct-current electrode area; 26-alternating-current electrode area; 27-ground electrode area; 28-alignment pattern electrode area; 29-direct-current electrode; 30-alternating-current electrode; 31-alignment mark; 32-output optical or input optical waveguide; 33-ground electrode; and 34-frontal surface.

DETAILED DESCRIPTION OF THE PREFERRED EMBODIMENTS

The invention will be further illustrated below through combining the drawings and detailed embodiments, in order that those skilled in the art would better understand and carry out the invention; however, the embodiments illustrated are not used to limit the invention.

Figure 1:
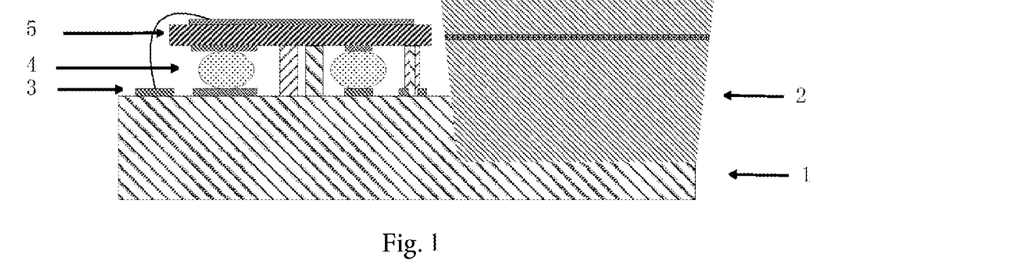
FIG. 1 is a schematic structural view of the silica-on-silicon-based hybrid integrated optoelectronic chip provided by the invention.

A silica-on-silicon-based hybrid integrated optoelectronic chip is provided by the invention, the structure of which comprises a silicon substrate 1, which is a silicon substrate of a silicon-based waveguide structure and the surface of which is provided with a platform 8, a groove 10 and a plurality of lug bosses, wherein the lug bosses are of lug boss structures that are protruded from the surface of the platform 8, and the groove is of a groove structure that is concavely embedded under the platform 8; a silica waveguide element 2, which is arranged in the groove 10 of the silicon substrate 1; a metal electrode layer 3, which is manufactured from a part of metal electrode layer 3 on the surface of the platform 8 on the silicon substrate 1; solder bumps 4, which are manufactured above a part of the metal electrode layer 3; an active optoelectronic chip 5, which is arranged above the solder bumps 4 and the lug bosses.

The silicon substrate 1 is of material with high resistivity, and high-frequency transmission with low loss and meanwhile good thermal conductivity coefficient can be achieved by the metal electrode layer 3 that is made from the material. The lug bosses, a platform 8 and a groove 10 are manufactured on the silicon substrate 1 in the invention, wherein the platform 8 is a silicon bottom layer from which the lug bosses are manufactured after a first silicon etching, and the groove 10 is a bottom layer from which the groove 10 is manufactured after a second silicon etching.

The lug bosses comprise a horizontal alignment lug boss 6 and a vertical alignment lug boss 7. The height of the horizontal alignment lug boss 6 is the same as that of the vertical alignment lug boss 7, both of which being 10 μm-100 μm. A cross-sectional pattern of the horizontal alignment lug boss 6 can be used for alignment during the manufacturing progress of the silica waveguide, in order to achieve fixation of the position of a silica waveguide layer with respect to the horizontal alignment lug boss 6. A cross-sectional pattern of the horizontal alignment lug boss 6 can be used to achieve the overlap with an alignment mark in etching the metal electrode layer 3, in order to achieve the overlap between the positions of the metal electrode layer 3 and the solder bumps 4 thereon and the position of the electrode on the active optoelectronic chip 5 to facilitate electrical interconnections. In addition, the alignment pattern and a special pattern on the surface of the chip can also be used for alignment in the flip-chip bonding for the active optoelectronic chip 5. Thus, a parallel alignment can be achieved between the silica waveguide element 2 and the waveguide on the active optoelectronic chip 5 to realize high-efficiency coupling through arranging the horizontal alignment lug boss 6 in the horizontal direction; and in the vertical direction, the solder bumps 4 only need to be manufactured in particular areas on the metal electrode layer 3, which specifically are in the direct-current electrode area 25 and an alternating-current electrode area 26 of the metal electrode layer 3, and thus good contact with the active optoelectronic chip 5 during a bonding progress can be guaranteed.

The cross-sectional pattern of the horizontal alignment lug boss 6 and the alignment marks on a waveguide mask, the metal electrode layer 3 and the active optoelectronic chip 5 are identical or complementary, as a reference position for optical coupling and electrical interconnections. If the cross-section of an alignment mark on the active optoelectronic chip 5 is a cross alignment mark, the same cross-sectional pattern of the horizontal alignment lug boss 6 is cross, and the complementary cross-sectional pattern is with four diamonds for filling the blank in the cross alignment mark. The alignment mark on the waveguide mask can be aligned with the cross-sectional pattern of the horizontal alignment lug boss 6 when a common optical etching is used to manufacture the structure of the silica waveguide element 2, in order to realize the fixation of the position of the silica waveguide layer relative to the horizontal alignment lug boss 6. The alignment mark on the waveguide mask can be aligned with the cross-sectional pattern of the horizontal alignment lug boss 6 when a common optical etching is used to manufacture the metal electrode layer 3, in order to realize the fixation of the position of the metal electrode layer 3 relative to the horizontal alignment lug boss 6 and in order to realize the overlap between the positions of the metal electrode layer 3 and the solder bumps 4 thereon and the position of the electrode on the active optoelectronic chip 5 to facilitate electrical interconnections. In addition, the alignment pattern and an alignment pattern on the frontal surface of the active optoelectronic chip 5 can also be used for alignment in the flip-chip bonding for the active optoelectronic chip 5. Thus, a parallel alignment can be achieved between the silica waveguide element 2 and the waveguide on the active optoelectronic chip 5 to realize high-efficiency coupling through arranging the horizontal alignment lug boss 6 in the horizontal direction; and in the vertical direction, the solder bumps 4 only need to be manufactured in the direct-current electrode area 25 and the alternating-current electrode area 26 of the metal electrode layer 3, and thus good electrical interconnection between the active optoelectronic chip 5 and the metal electrode layer 3 can be guaranteed. The horizontal alignment lug boss 6 is required to be aligned with the alignment mark on the active optoelectronic chip 5, therefore, the horizontal position thereof is determined by the relative position between the alignment mark on the active optoelectronic chip 5 and the waveguide on the active optoelectronic chip 5, and the number thereof is determined by the number of alignment marks on the active optoelectronic chip 5.

The vertical alignment lug boss 7 is used for waveguides of a laser or a detector and is in height alignment with the silica waveguide layer. Because material growth and bonding processes are used and the vertical position of the silica waveguide layer is fixed relative to the platform 8 on the silicon substrate 1, the position of the silica waveguide layer is also fixed relative to the vertical position of the vertical alignment lug boss 7. The surface of the active optoelectronic chip 5 can be tightly attached to and aligned with the vertical alignment lug boss 7 during the bonding progress of the active optoelectronic chip 5, and thus optical coupling alignment between waveguides in the vertical direction can be achieved with high accuracy and influence of errors in the height of the solder bumps 4 on optical coupling is avoided. The vertical alignment lug boss 7 is correspondingly arranged in the middle part of the active optoelectronic chip 5 in a horizontal relative position, is arranged symmetrically on the two sides of the output optical or input optical waveguide on the active optoelectronic chip 5, and could not be connected with any metal electrode layer 3. The vertical alignment lug boss 7 is of a structure with a plurality of circular cylinders or square cylinders or the like, which is beneficial to support the chip. The cross-sectional area of a single vertical alignment lug boss 7 is 100 $\mu m^2$-40000 $\mu m^2$, the number thereof is 4-10 and the specific number is determined by the ratio between the area of a middle part of the active optoelectronic chip 5 and the cross-sectional area of a single lug boss, and the height thereof is determined by the vertical position of the silica waveguide layer.

The silica waveguide element 2 comprises a silica substrate layer 13, a silica waveguide layer 14 and a silica upper covering layer 15. The silica waveguide layer 14 is arranged above the silica substrate layer 13, and comprises a general waveguide area 17, a coupling area in close proximity to the active optoelectronic chip 16 and a coupling area in close proximity to an optical fiber 18. The silica waveguide layer 14 is of silica with high reflective index, the reflective index of the silica substrate layer 13 being the same as that of the silica upper covering layer 15, and the difference in reflective index of the material of the silica waveguide layer 14, the silica substrate layer 13 and the silica upper covering layer 15 is 0.5%-2.5%. The waveguide width of the coupling area in close proximity to the active optoelectronic chip 16 is narrower than that of a general waveguide area, i.e., 3 μm-7 μm; and the waveguide width of the coupling area 18 in close proximity to the optical fiber is wider than that of a general waveguide area, i.e., 6 μm-10 μm.

The coupling area in close proximity to the active optoelectronic chip 16 has a smaller waveguide width, by which a smaller light spot formed by the coupling area in close proximity to the active optoelectronic chip 16 can be guaranteed in combination with a high difference in reflective index, in order to realize high-efficiency optical coupling with the active optoelectronic chip 5. The coupling area in close proximity to the optical fiber 18 has a larger waveguide width for increasing the diameter of the light spot, in order to realize high-efficiency optical coupling with the optical fiber. Outside end faces 19 of the coupling area in close proximity to the active optoelectronic chip 16 and the coupling area in close proximity to the optical fiber 18 are both inclined end faces at 5°-45° inclination, the inclination direction being perpendicular to the horizontal direction or the longitudinal direction of the central axis for light output or light input in a waveguide, in order to decrease the influence of reflection by an end face of a waveguide on the active optoelectronic chip 5. The interval between the outside surface of the silica waveguide element 2 which is in close proximity to the active optoelectronic chip 16 and the external side of the output optical or input optical waveguide in the active optoelectronic chip 5 is the optimal interval when no reflected light on end faces goes into the active optoelectronic chip 5, the selection principle of the interval is that the largest range of reflected light on the outside surface of the silica waveguide element 2 which is in close proximity to the active optoelectronic chip 16 deviates from the end faces of the output optical or input optical waveguide in the active optoelectronic chip 5, meanwhile the dimension of the near-field light spot of the active optoelectronic chip 5 at the external side of the coupling area is the same as or close to that of the light spot in the coupling area 16 in close proximity to the active optoelectronic chip 5, the far-field divergence angle of the active optoelectronic chip 5 is the same as or close to the maximum incident angle of the coupling area in close proximity to active optoelectronic chip 16, and thus high coupling efficiency can be realized while influence on the performance of the active optoelectronic chip 5 by reflected light can be avoided.

The thickness of the metal electrode layer 3 is 0.2 μm-3 μm, and is of a multi-layer metal structure such as a Ti/Pt/Au layered structure. The metal electrode layer 3 is manufactured on the platform 8 of the silicon substrate 1, and the multi-layer structure of the metal electrode layer 3 is required to be in good contact with the silicon substrate 1 and the solder bumps 4. The metal electrode layer 3 is a metal electrode with a special structure and comprises a direct-current electrode area 25, an alternating-current electrode area 26, a ground electrode area 27 and an alignment pattern electrode area 28, the four areas being electrode structures in a horizontal distribution. The direct-current electrode area 25 and the alternating-current electrode area 26 are arranged right under the direct-current electrode 29 and the alternating-current electrode 30 of the active optoelectronic chip 5, and solder bumps 4 are manufactured on the direct-current electrode area 25 and the alternating-current electrode area 26 which are used for loading direct-current and alternating-current electrical signals onto the active optoelectronic chip 5. Extended electrodes are provided to the direct-current electrode area 25 and the alternating-current electrode area 26 and are extended to the ends away from the lug bosses on the platform 8, so as to facilitate the interconnections with gold wire leads among package tube shells of the chip. The ground electrode area 27 is arranged on the end away from the silicon lug bosses on the platform 8 and is connected with the back face electrode of the active optoelectronic chip 5 through gold wire leads. As illustrated before, the alignment pattern electrode area 28 is aligned with the horizontal alignment lug boss 6 in the lug bosses.

The solder bumps layer comprises a plurality of solder bumps, metal transition layer made from material among the metal electrode layer 3 and the III-V lasers or detectors is chosen, the material thereof being metal material that is easy to be melted and soldered, with the melting point being less than 400° C., and with good adhesion with the metal in electrodes, such as AuSn, PbSn, SnAgCu, etc., the thickness thereof being required to be just above the surface of the lug bosses after being manufactured on the metal electrode layer 3 so as for post pressing. The solder bumps 4 are manufactured only on the direct-current electrode area 25 and the alternating-current electrode area 26 in the metal electrode layer at the time of manufacture, the number thereof being determined by the proportions between the area of the metal electrode layer 3 and that of the solder bumps 4. The solder bumps 4 can be manufactured through ball plant and reflow processes, and no solder bumps 4 should overflow the direct-current electrode area 25 and the alternating-current electrode area 26 of the metal electrode layer 3 during the ball plant and reflow procedure and in later bonding process for the active optoelectronic chip 5.

The active optoelectronic chip 5 is a waveguide typed III-V laser or detector, the frontal surface thereof being provided with a direct-current electrode, an alternating-current electrode and an alignment mark, the back face thereof being provided with a ground electrode, and the middle part thereof being provided with an output optical or input optical waveguide. The direct-current and alternating-current electrode areas on the frontal surface contact with the direct-current electrode area 25 and the alternating-current electrode area 26 of the metal electrode layer 3 through the solder bumps 4 and after the contact with the solder bumps 4, the alignment mark on the frontal surface is aligned with the alignment mark of the metal electrode layer 3 or the horizontal alignment lug boss 6. Alloy is formed between the direct-current and alternating-current electrode layers on the frontal surface on the active optoelectronic chip 5 and the solder bumps 4 using a combination process of the thermal reflow soldering and the flip chip bonding, is pressed down until the frontal surface of the active optoelectronic chip 5 contacts with the silicon vertical alignment lug boss 7, and not only low contact resistance is guaranteed but also the coupling position for output optical or input optical waveguide on the active optoelectronic chip 5 is fixed, the electrode on the back face is connected onto the ground electrode area 27 of the metal electrode layer 3 through gold ball bonding or wedge bonding.

The silica-on-silicon-based hybrid integrated optoelectronic chip proposed by the invention can be applied to hybrid integration of a single-path or multi-path laser or detector chip and a silica-on-silicon waveguide device, such as a beam splitter, a beam combiner, an AWG, etc. and to a multi-path optical transceiver integrated TOSA or ROSA device. An III-V laser or detector chip and a silicon-based waveguide device are used by the hybrid integrated optoelectronic chip, respectively, characteristics of devices of different materials on active and passive performance is used, and advantages in mature process and excellent performance for a unit chip are provided. A manufacturing method for a silica-on-silicon-based hybrid integrated optoelectronic chip is also provided by the invention, comprising specifically a few steps below:

Step 1: manufacturing a silicon substrate and manufacturing a silica waveguide element in a groove 10 of the silicon substrate.

Because a silica bonding process or a silica growth process can be used in manufacturing a silica waveguide element 2, the silica bonding process can be used during manufacture if a prepared silica waveguide element 2 is available, and the silica growth process can be used during manufacture if a prepared silica waveguide element 2 is not available. The specific preparation procedure when the silica bonding process is used for manufacturing the silica waveguide element 2 is as follows:

1. Manufacturing the Silica Waveguide Element Using the Silica Bonding Process

Figure 2A:
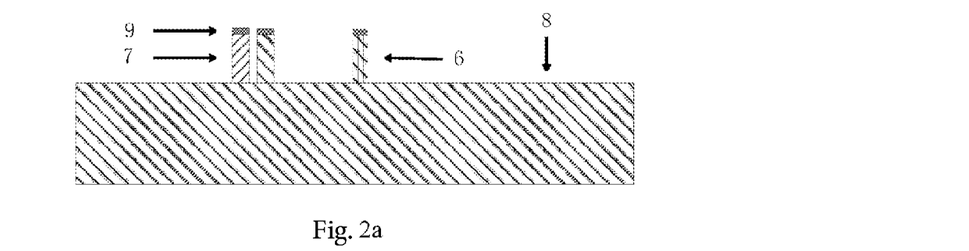
FIG. 2a-FIG. 2c are schematic flowcharts for manufacturing the silica-on-silicon-based waveguide element using the silica bonding process.

Step 1: lug bosses on a the silicon substrate 1 is manufactured using a common lithography process and a silicon etching process on the surface of the silicon substrate 1, as seen in FIG. 2a. The lug bosses comprise a horizontal alignment lug boss 6 and a vertical alignment lug boss 7; i.e., a first silicon etching is performed. The etching depth being 10 μm-100 μm; that is, the height of the horizontal alignment lug boss 6 and the vertical alignment lug boss 7 formed after etching is 10 μm-100 μm. The specific etching depth is determined by the height relationship between the silica waveguide layer and the input optical or output optical waveguide on the active optoelectronic chip 5 with respect to the surface of the silicon substrate 1, and the silicon waveguide layer is leveled with the height of the input optical or output optical waveguide on the active optoelectronic chip 5. A smooth platform 8 and lug bosses arranged thereon are formed after the first silicon etching, and a first photoresist layer 9 left over by the first silicon etching is reserved above the lug bosses.

The cross-sectional pattern of the horizontal alignment lug boss 6 and the alignment marks on a waveguide mask, the metal electrode layer 3 and the active optoelectronic chip 5 are identical or complementary, as a reference position for optical coupling and electrical interconnections. If the cross-section of an alignment mark on the active optoelectronic chip 5 is a cross alignment mark, the same cross-sectional pattern of the horizontal alignment lug boss 6 is cross, and the complementary cross-sectional pattern is with four diamonds for filling the blank in the cross alignment mark. The horizontal alignment lug boss 6 is required to be aligned with the alignment mark on the active optoelectronic chip, therefore, the horizontal position thereof is determined by the relative position between the alignment mark on the active optoelectronic chip and the waveguide on the active optoelectronic chip, and the number thereof is determined by the number of alignment marks on the active optoelectronic chip.

The vertical alignment lug boss 7 is arranged in the middle part of the active optoelectronic chip 5 in a horizontal relative position, is arranged symmetrically on the two sides of the output optical or input optical waveguide on the active optoelectronic chip 5, and could not be connected with any metal electrode layer 3. The vertical alignment lug boss 7 is of a structure with a plurality of circular cylinders or square cylinders or the like; the cross-sectional area of a single vertical alignment lug boss 7 is 100 μm²-40000 μm², the number thereof is 4-10 and the specific number is determined by the ratio between the area of a middle part of the active optoelectronic chip 5 (the substrate area between the direct-current electrode and the alternating-current electrode on the active optoelectronic chip 5) and the cross-sectional area of a single vertical alignment lug boss.

Figure 2B:
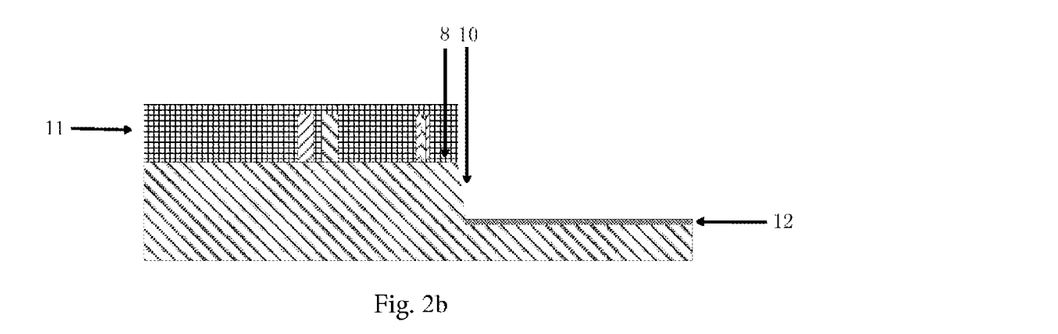

Step 2: manufacturing a groove 10 on the surface of the platform 8, which is a second silicon etching, as seen in FIG. 2b. Firstly, the photoresist 9 left over by the first silicon etching is removed, and a second photoresist layer 11 is manufactured above the platform 8 and the lug bosses using the common lithography, the thickness thereof being larger than the height of the lug bosses so as to protect the lug bosses (6, 7) and define the border of the groove 10. The groove 10 is then manufactured on the second photoresist layer 11 and one side of the lug boss 8 using the silicon etching process, the etching depth being 100 μm-1500 μm and being larger than the thickness of the second photoresist layer 11. The second photoresist layer 11 after the second silicon etching is reserved. The depth of the groove 10 is 100 μm-1500 μm and is specifically determined by the distance from the silica waveguide layer to the bottom surface of the silica element together with the distance from the silica waveguide layer to the surface of the silicon platform 8. The groove 10 is a groove of a rectangular shape, the width and length thereof being both larger than the width and length of the silica waveguide element 2, and a side wall in the groove away from the platform 8 in the groove 10 and other two side walls in the groove of the groove next to the side wall are categorized as a reserved area. The categorized reserved area is removed in a slicing process after the accomplishment of manufacturing a whole hybrid integrated wafer and thus only a side wall in the groove on the side which is in close proximity to the lug boss 6 and the platform 8 is left over, as shown in FIG. 3b.

Figure 2C:
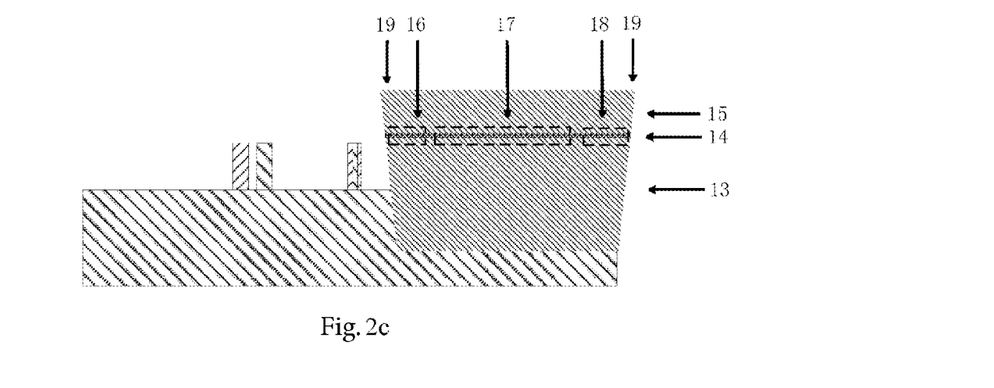

Step 3: Manufacturing the silica waveguide element 2 using a silica thermal bonding process. The thermal oxidation or the plasma enhanced chemical vapor deposition (PECVD) is used on the surface of the groove 10 to grow a silica bonding layer 12, the depth of which being 0.01 μm-1 μm, as shown in FIG. 2c. Next, the second photoresist layer 11 after the second silicon etching in the step 2 is removed and a prepared silica waveguide element 2 is manufactured in the groove 10 on the silicon substrate 1 using again the silica bonding layer 12 through a high-temperature bonding process so that the silica bonding layer 12 is melted into a silica substrate layer 13. Meanwhile, the silica waveguide element 2 is moved until an end surface of a coupling area 16 in close proximity to the active optoelectronic chip is contact closely to a side wall near to the lug bosses of the groove 10 . The structure of a prepared silica waveguide element 2 comprises a silica substrate layer 13, a silica waveguide layer 14 and a silica upper covering layer 15, wherein the silica substrate layer 13 is arranged on the bottom of the groove 10, and the silica waveguide layer 14 is perpendicular to a strip structure on the bottom of the groove 10 and in close proximity to a side wall in the groove. The thickness of the silica substrate layer 13 is 500 μm-1000 μm, the thickness of the silica waveguide layer 14 is 3 μm-50 μm, and the thickness of the silica upper covering layer 15 is 50 μm-1000 μm. The silica waveguide layer 14 comprises horizontally the coupling area 16 in close proximity to the active optoelectronic chip, a general waveguide area 17 and an optical fiber coupling area in close proximity to an optical fiber. The silica waveguide layer 14 is silica with high reflective index, the difference in reflective index among the silica waveguide layer 14 and the silica substrate layer 13 and the silica upper covering layer 15 is 0.5%-2.5%, and the reflective index of the material of the silica substrate layer 13 is the same as that of the silica upper covering layer 15. The waveguide width of the general waveguide area 17 is 6 μm-9 μm; the waveguide width of the coupling area in close proximity to the active optoelectronic chip 16 is narrower than that of the general waveguide area 17 and is 3 μm-7 μm; and the waveguide width of the coupling area in close proximity to the optical fiber 18 is wider than that of the general waveguide area 17 and is 8 μm-10 μm. Outside end faces 19 of the coupling area in close proximity to the active optoelectronic chip 16 and the coupling area in close proximity to the optical fiber 18 are both inclined end faces at 5°-45° inclination with respect to the vertical direction, and is perpendicular to the central axis for light output or light input in a vertical waveguide.

2. Manufacturing the Silica Waveguide Element Using the Silica Growth Process

Figure 3A:
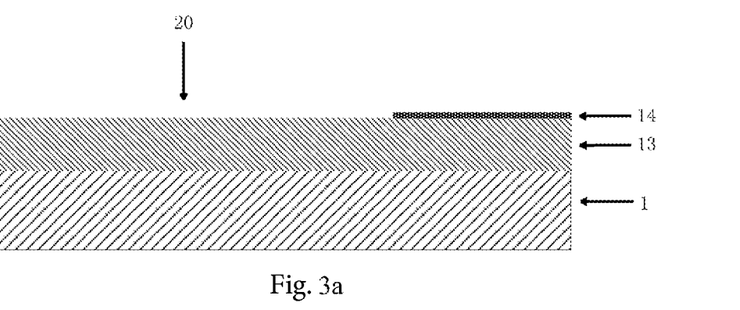
Figure 3B:
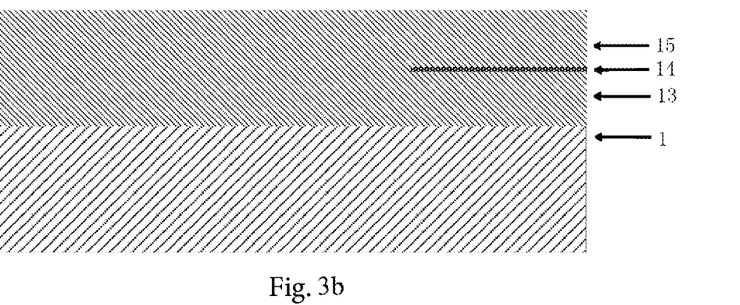

Step 1: manufacturing the silica waveguide element 2, as shown in FIG. 3*a*. A silica substrate layer 13 and a silica waveguide layer 14 grow on the whole silicon substrate 1 using the silica growth process and using the plasma enhanced chemical vapor deposition (PECVD). A doped silica waveguide layer 14 can be manufactured using synchronously gas mixture injection, such as germane, etc. for waveguide doping during growth. Next, the silica waveguide layer 14 is manufactured using the common lithography and the silicon etching processes, the silica is etched until the silica substrate layer 13 is reached, and the waveguide layer on one side of the light emitting face of the silica waveguide is also etched until the silica substrate layer 13 is reached, the reserved length of the reserved area being 500 µm-1500 µm. The silica waveguide layer 14 is silica with high reflective index, the difference in reflective index among the silica waveguide layer 14, the silica substrate layer 13 and the silica upper covering layer 15 is 0.5%-2.5%. The silica waveguide layer 14 comprises a coupling area in close proximity to the active optoelectronic chip 16, a general waveguide area 17 and a coupling area in close proximity to an optical fiber 18. The waveguide width of the general waveguide area 17 is 6 µm-9 µm; the waveguide width of the coupling area in close proximity to the active optoelectronic chip 16 is narrower than that of the general waveguide area 17 and is 3 µm-7 µm; and the waveguide width of the coupling area in close proximity to the optical fiber 18 is wider than that of the general waveguide area 17 and is 8 µm-10 µm. The thickness of the silica substrate layer 13 is 50 µm-1000 µm, and the thickness of the silica waveguide layer 14 is 3 µm-50 µm.

Figure 3C:
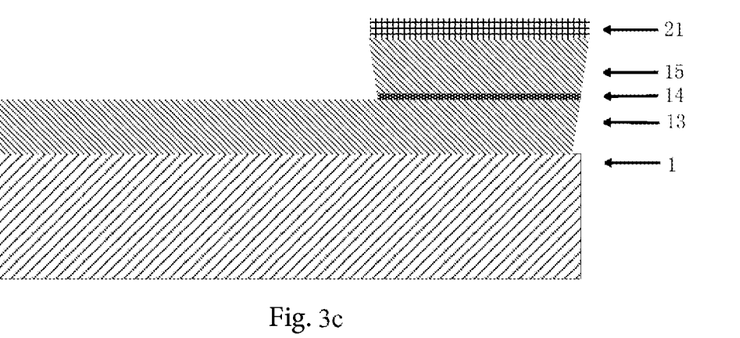

Step 2: manufacturing the silica upper covering layer and the inclined end faces. The silica upper covering layer 15 continues to grow above the silica waveguide layer 14 and the reserved area 20 using the plasma enhanced chemical vapor deposition (PECVD), and then a high-temperature thermal annealing is performed, as shown in FIG. 3*b*. The silica upper covering layer 15 on the upper part of the silica waveguide layer 14 is protected using the common lithography, and a part of the upper covering layer 15 is etched off on the reserved area 20 using the silica etching process until the silica substrate layer 13 is exposed, a third photoresist layer 21 left over above the etched silica upper covering layer 15 being reserved, as can be seen in FIG. 3*c*. Next, inclined end faces 19 are manufactured on both sides of the silica waveguide layer 14 using an end face polishing process. Outside end faces 19 of the coupling area in close proximity to the active optoelectronic chip 16 and the coupling area in close proximity to the optical fiber 18 are both inclined end faces at 5°-45° inclination with respect to the vertical direction, and the outside end faces is perpendicular to the central axis for light output or light input in a vertical waveguide. The thickness of the silica covering layer 15 is 50 µm-1000 µm.

Figure 3D:
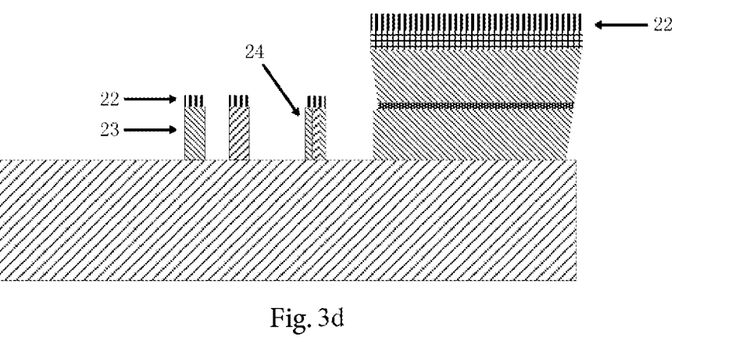

Step 3: manufacturing the horizontal alignment lug boss 6 and the vertical alignment lug boss 7. The upper covering layer 15 and the waveguide structure on the lower layer thereof are protected and the position and the shape of the silica alignment lug bosses are defined using a fourth photoresist layer 22 on the silica reserved area 20 by using the common lithography and the silica etching processes. The silica substrate layer 13 is etched until the surface of the silicon substrate 1 is reached and a silica vertical alignment lug boss 23 and a silica horizontal alignment lug boss 24 are manufactured, as can be seen in FIG. 3*d*. The positions and shapes of the silica horizontal alignment lug boss 24 and the silica vertical alignment lug boss 23 are identical to those of the horizontal alignment lug boss 6 and the vertical alignment lug boss 7 described in step 1, i.e., manufacturing the silica waveguide element using the silica bonding process. The fourth photoresist layer 22 left over after etching is reserved and the silica substrate 1 is continuously silicon etched by changing to use the silicon etching process, the etching depth being 10 µm-100 µm, as can be seen in FIG. 3*e*. Due to the protection and self-alignment of the fourth photoresist layer 22, the vertical alignment lug boss 7 and a lug boss horizontal alignment 6 are formed on the lower part of the silica vertical alignment lug boss 23 and the silica horizontal alignment lug boss 24. The positions and the shape of cross-sections of the silica vertical alignment lug boss 23 and the silica horizontal alignment lug boss 24 manufactured in this method are identical to those of the vertical alignment lug boss 7 and the lug boss horizontal alignment 6, and are identical also to the positions and the shape of cross-sections of the vertical alignment lug boss 7 and the lug boss horizontal alignment 6 described in step 1, i.e., manufacturing the silica waveguide element 2 using the silica bonding process. The total height of the silica vertical alignment lug boss 23 and the silica horizontal alignment lug boss 24 and the vertical alignment lug boss 7 and the lug boss horizontal alignment 6 is 10 µm-100 µm and the specific height is determined by the relationship in height of the silica waveguide layer 14 and the input optical or output optical waveguide on the active optoelectronic chip 5 with respect to the surface of the silicon substrate 1, and it is guaranteed that the silica waveguide layer 14 is leveled with the height of the input optical or output optical waveguide on the active optoelectronic chip 5. Finally, the third photoresist layer 21 and the fourth photoresist layer 22 left over are removed.

Step 2: Manufacturing a metal electrode layer 3.

Figure 4A:
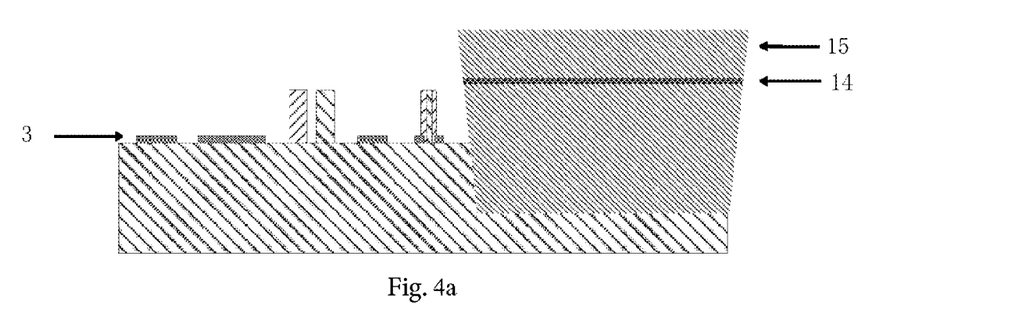
FIG. 4a and FIG. 4b are structural side view and top view for manufacturing high-frequency electrode-on-silicon.
Figure 4B:
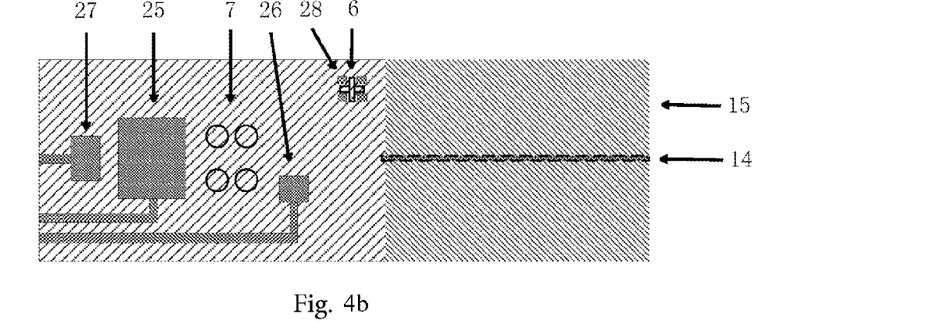

The silica waveguide area 14 is protected and a metal electrode pattern is defined on the surface of the silicon substrate 1 using the photoresist, the vertical alignment lug boss 6 is used to be aligned with the alignment mark on a metal electrode mask, a metal electrode layer 3 is manufactured on the platform 8 by using the common lithography, a metal sputtering and steaming, and a metal stripping processes, as can be seen in FIGS. 4*a* and 4*b*. The thickness of the metal electrode layer 3 is 0.2 µm-3 µm and is of a multi-layer structure, such as a Ti/Pt/Au layered structure. The metal electrode layer 3 is manufactured on the platform 8 of the silicon substrate 1, and the multi-layer structure of the metal electrode layer 3 is required to be in good contact with the silicon substrate 1 and the solder bumps 4. The metal electrode layer 3 is a metal electrode with a special structure and comprises a direct-current electrode area 25, an alternating-current electrode area 26, a ground electrode area 27 and an alignment pattern electrode area 28, the four areas being electrode structures in a horizontal distribution. The direct-current electrode area 25 and the alternating-current electrode area 26 are arranged right under the direct-current electrode 29 and the alternating-current electrode 30 of the active optoelectronic chip 5, and solder bumps 4 are manufactured on the direct-current electrode area 25 and the alternating-current electrode area 26 which are used for loading direct-current and alternating-current electrical signals onto the active optoelectronic chip 5. Extended electrodes are provided to the direct-current electrode area 25 and the alternating-current electrode area 26 and are extended to the ends away from the lug bosses on the platform 8, so as to facilitate the interconnections with gold wire leads among package tube shells of the chip. The ground electrode area 27 is arranged on the end away from the silicon lug bosses on the platform 8 and is connected with the back face electrode of the active optoelectronic chip 5 through gold wire leads. As illustrated before, the alignment pattern electrode area 28 is aligned with the horizontal alignment lug boss 6 in the lug bosses.

Figure 5:
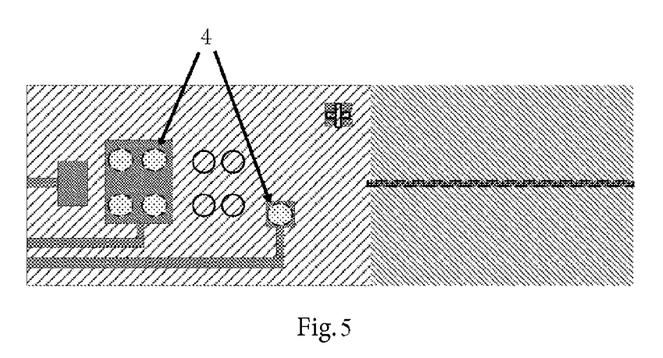
FIG. 5 is a schematic view of manufacturing solder bumps on the high-frequency electrode.

Step 3: the solder bumps 4 are manufactured on the metal electrode layer 3, and an alignment mark 28 of the metal electrode or the silicon horizontal alignment lug boss 6 is aligned with an alignment mark of a ball planting machine for solder bumps, and the solder bumps 4 are manufactured by using ball plant and reflow processes, as can be seen in FIG. 5. The solder bumps 4 are only manufactured on the direct-current electrode area 25 and the alternating-current electrode area 26 on the metal electrode layer 3, the number thereof is determined by the proportions between the area of the metal electrode and that of the solder bumps 4. The solder bumps 4 can be manufactured through ball plant and reflow processes, and no solder bumps 4 should overflow the direct-current electrode area 25 and the alternating-current electrode area 26 of the metal electrode layer 3 during the ball plant and reflow procedure and in later bonding process for the active optoelectronic chip 5.

Figure 6A:
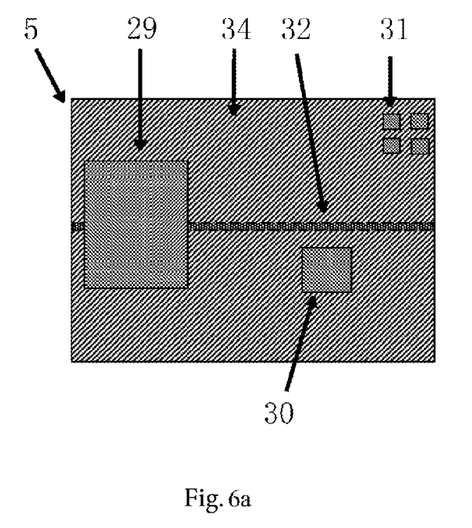
FIG. 6a is a schematic frontal structural view of the active optoelectronic chip.
Figure 6B:
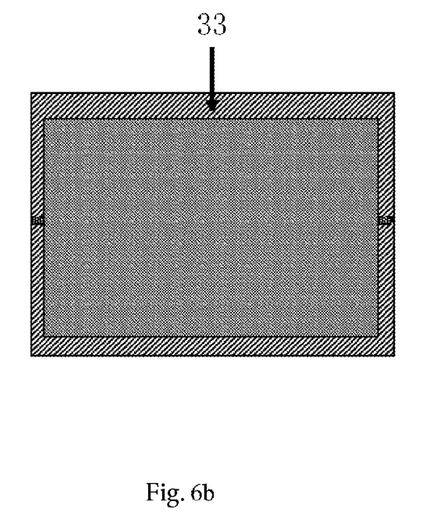
FIG. 6b is a schematic back structural view of the active optoelectronic chip.
Figure 6C:
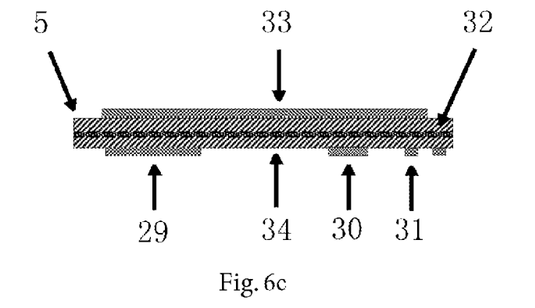
FIG. 6c is a schematic side structural view of the active optoelectronic chip.
Figure 7:
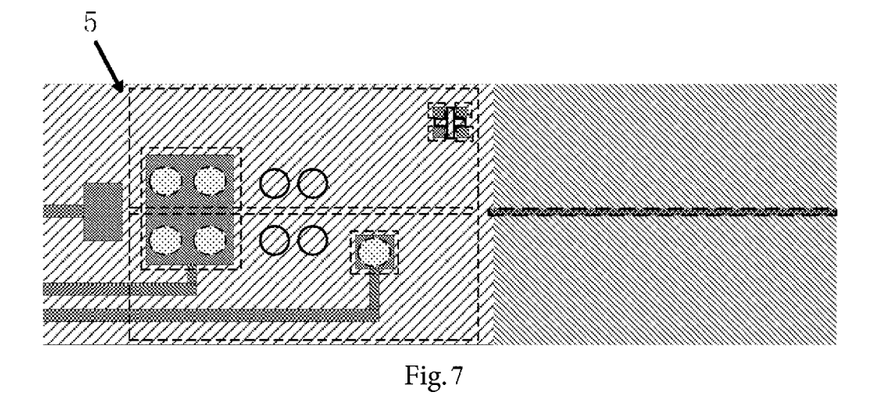
FIG. 7 is a schematic view of the coupling alignment and the overlapped electrodes after the active optoelectronic chip is flip bonded to the high-frequency electrode.

Step 4: soldering the active optoelectronic chip 5. The active optoelectronic chip 5 is a waveguide typed III-V laser or detector, the frontal surface thereof being provided with a direct-current electrode 29, an alternating-current electrode 30 and an alignment mark 31, the middle part thereof being provided with an output optical or input optical waveguide 32, and the back face thereof being provided with a ground electrode 33, the lower part of the electrode on the frontal surface being the front surface 34, as can be seen in FIG. 6a-FIG. 6c. The alignment pattern electrode area 28 or the horizontal alignment lug boss 6 are used to be aligned with the alignment mark 31 on the active optoelectronic chip 5, and the metal electrode layer 3 of the active optoelectronic chip 5 is manufactured on the solder bumps 4 by using the combination process of thermal reflow soldering and flip-chip bonding, as can be seen in FIG. 7. The direct-current electrode 29 and the alternating-current electrode 30 on the frontal surface contact with the upper part of the solder bumps 4 in the direct-current electrode area 25 and the alternating-current electrode area 26 on the metal electrode layer 3, respectively. After the contact with the solder bumps 4, the alignment mark on the frontal surface is aligned with the alignment mark of the alignment pattern electrode area 28 or the horizontal alignment lug boss 6. Alloy is formed between the direct-current electrode 29 and alternating-current electrode 30 on the frontal surface on the active optoelectronic chip 5 and the solder bumps 4 using a combination process of the thermal reflow soldering and the flip chip bonding, and is pressed down until the frontal surface 34 of the active optoelectronic chip 5 contacts with the silicon vertical alignment lug boss 7, as can be seen in FIG. 1.

Step 5: the ground electrode 33 on the back surface of the active optoelectronic chip 5 is connected with the ground electrode area 27 on the metal electrode layer 3 through a gold wire, as shown in FIG. 1.

The embodiments illustrated above are preferred embodiments cited only to fully explain the invention, and the scope of the invention is not limited therein. Equivalent substitutions and modifications made on the basis of the invention by those skilled in the art would be within the scope of the invention. The scope of the invention is defined by the Claims.

The invention claimed is:

1. A silica-on-silicon-based hybrid integrated optoelectronic chip, characterized in that it comprises a silica substrate, the surface of the silicon substrate is provided with a platform, lug bosses and a groove, a silica waveguide element is arranged in the groove, the lug bosses are protruded from the surface of the platform, the surface of the platform is provided with a discontinuous metal electrode layer, the surface of the metal electrode layer is provided with solder bumps, and an active optoelectronic chip is arranged above the solder bumps and the lug bosses.

2. The silica-on-silicon-based hybrid integrated optoelectronic chip of claim 1, characterized in that the silica waveguide element comprises longitudinally in sequence a silica substrate layer, a silica waveguide layer and a silica upper covering layer; the silica waveguide element comprises horizontally in sequence a waveguide area, a coupling area in close proximity to the active optoelectronic chip and a coupling area in close proximity to an optical fiber; the width of the waveguide in the coupling area in close proximity to the active optoelectronic chip is 3 μm-7 μm; and the width of the waveguide in the coupling area in close proximity to the optical fiber is 6 μm-10 μm.

3. The silica-on-silicon-based hybrid integrated optoelectronic chip of claim 2, characterized in that the lug bosses comprise a horizontal alignment lug boss and a vertical alignment lug boss, and the height of the horizontal alignment lug boss is equal to that of the vertical alignment lug boss, both of which being 10 μm-100 μm.

4. The silica-on-silicon-based hybrid integrated optoelectronic chip of claim 3, characterized in that the number and the horizontal position of the horizontal alignment lug boss are determined by the relative position of an alignment mark on the active optoelectronic chip and the waveguide on the active optoelectronic chip, the height of the vertical alignment lug boss is determined by the vertical position of the silica waveguide layer in the silica waveguide element, and the vertical alignment lug boss is arranged at the middle part of the active optoelectronic chip.

5. The silica-on-silicon-based hybrid integrated optoelectronic chip of claim 3, characterized in that the thickness of the metal electrode layer is 0.2 μm-3 μm, and the metal electrode layer comprises a direct-current electrode area, an alternating-current electrode area, a ground electrode area and an alignment pattern electrode area; the lug bosses are arranged between the direct-current electrode area and the alternating-current electrode area, and the direct-current electrode area and the alternating-current electrode area, above which solder bumps are manufactured, contact with the direct-current electrode and the alternating-current electrode of the active optoelectronic chip through the solder bumps; a frontal alignment mark of the active optoelectronic chip and the horizontal alignment lug boss or the alignment mark of the metal electrode layer are aligned; and a back electrode of the active optoelectronic chip is connected with the ground electrode area of the metal electrode layer.

6. The silica-on-silicon-based hybrid integrated optoelectronic chip of claim 1, characterized in that the silica waveguide element is provided with an outer end face at 5°-45° inclination to the vertical direction.

7. A manufacturing method for a silica-on-silicon-based hybrid integrated optoelectronic chip, characterized in that it comprises a few steps below:

Step 1: manufacturing a silicon substrate and manufacturing a silica waveguide element in a groove of the silicon substrate;

Step 2: manufacturing a metal electrode layer on the silicon substrate;

Step 3: manufacturing solder bumps above the direct-current electrode area and the alternating-current electrode area of the metal electrode layer;

Step 4: Soldering an active optoelectronic element above the solder bumps and a vertical alignment lug boss.

8. The manufacturing method for a silica-on-silicon-based hybrid integrated optoelectronic chip of claim 7, characterized in that a silica growth process or a silica thermal bonding process is used in manufacturing the silica waveguide element in the step 1.

9. The manufacturing method for a silica-on-silicon-based hybrid integrated optoelectronic chip of claim 8, characterized in that the step 1 includes a few steps below when a silica thermal bonding process is used in manufacturing the silica waveguide element:

Step 1: manufacturing a lug boss on the surface of the silicon substrate;

Step 2: manufacturing a groove on one side of the lug boss on the silicon substrate;

Step 3: growing a silica bonding layer on the bottom of the groove, manufacturing the silica waveguide element into the groove structure by using the silica thermal bonding process so that the bonding layer is melted into the silica substrate layer of the silica waveguide element and the silica waveguide element is provided with an outer end face at 5°-45° inclination to the vertical direction.

10. The manufacturing method for a silica-on-silicon-based hybrid integrated optoelectronic chip of claim 8, characterized in that the step 1 includes a few steps below when the silica growth process is used in manufacturing the silica waveguide element:

Step 1: growing a silica substrate layer and a silica waveguide layer on the surface of the silicon substrate, and etching off a part of the silica waveguide layer to form a reserved area;

Step 2: growing an upper covering layer above the silica waveguide layer that is reserved;

Step 3: etching the silica substrate layer in the reserved area to the surface of the silicon substrate to form a lug boss.

* * * * *